United States Patent
Ping

(10) Patent No.: US 9,338,918 B2
(45) Date of Patent: May 10, 2016

(54) SOCKET INTERPOSER AND COMPUTER SYSTEM USING THE SOCKET INTERPOSER

(71) Applicant: Samsung Electronics, Ltd., Gyeonggi-do (KR)

(72) Inventor: Zhan (John) Ping, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 336 days.

(21) Appl. No.: 13/939,046

(22) Filed: Jul. 10, 2013

(65) Prior Publication Data

US 2015/0016044 A1     Jan. 15, 2015

(51) Int. Cl.
    *H05K 7/10*     (2006.01)

(52) U.S. Cl.
    CPC .............. *H05K 7/10* (2013.01); *Y10T 29/49128* (2015.01)

(58) Field of Classification Search
    CPC ............................ H05K 7/10; Y10T 29/49128
    See application file for complete search history.

(56) References Cited

U.S. PATENT DOCUMENTS

| | | | | |
|---|---|---|---|---|
| 5,440,755 | A * | 8/1995 | Harwer et al. | 710/315 |
| 5,481,436 | A * | 1/1996 | Werther | 361/784 |
| 5,721,673 | A * | 2/1998 | Klein | 361/809 |
| 5,734,555 | A * | 3/1998 | McMahon | 361/704 |
| 6,366,467 | B1 * | 4/2002 | Patel et al. | 361/760 |
| 6,772,261 | B1 * | 8/2004 | D'Antonio et al. | 710/301 |
| 6,789,156 | B1 | 9/2004 | Waldspurger | |
| 6,837,719 | B2 * | 1/2005 | Panella | 439/67 |
| 6,885,563 | B2 * | 4/2005 | Panella et al. | 361/794 |
| 7,095,619 | B2 * | 8/2006 | Panella et al. | 361/760 |
| 7,329,054 | B1 * | 2/2008 | Epitaux et al. | 385/89 |
| 7,684,344 | B2 | 3/2010 | Aloni | |
| 7,945,740 | B2 | 5/2011 | Bandholz | |
| 7,979,645 | B2 | 7/2011 | Motohashi | |
| 8,156,230 | B2 | 4/2012 | Bakke | |
| 8,169,850 | B2 | 5/2012 | Sistla | |
| 8,255,608 | B2 | 8/2012 | Kuan | |
| 8,274,782 | B2 | 9/2012 | Blodorn | |

(Continued)

FOREIGN PATENT DOCUMENTS

WO      2011078855      6/2011

OTHER PUBLICATIONS

IBM Blade Center HS23, IBM Redbooks Product Guide, 35pp, http://www.redbooks.ibm.com/technotes/tips0843.pdf, Dec. 17, 2012.

(Continued)

*Primary Examiner* — Hoa C Nguyen
*Assistant Examiner* — Keith Depew
(74) *Attorney, Agent, or Firm* — Convergent Law Group LLP

(57) ABSTRACT

Exemplary embodiments include a socket interposer having a plurality of connectors and at least one of on-board memory and an external communication controller. The plurality of connectors is configured to fit with a form factor of a socket on a server board. The server board includes at least one processor and a circuit board having the socket and at least one processor socket. The processor(s) are coupled with the processor socket(s). The socket has the form factor configured for a module having a first functional set and the form factor. The at least one of the on-board memory and the external communication controller is coupled with at least some of the connectors. The external communication controller also has a second functional set different from the first functional set. The on-board memory is configured to be usable by the processor(s).

24 Claims, 5 Drawing Sheets

(56) References Cited

U.S. PATENT DOCUMENTS

| | | |
|---|---|---|
| 8,351,321 B2 | 1/2013 | Dapper |
| 8,370,508 B2 | 2/2013 | Harikumar |
| 8,908,385 B2 * | 12/2014 | Moessner et al. ............. 361/761 |
| 2008/0162873 A1 | 7/2008 | Zimmer |
| 2009/0197436 A1 * | 8/2009 | Trobough ....................... 439/67 |
| 2010/0058001 A1 | 3/2010 | Akaike |
| 2011/0161748 A1 | 6/2011 | Casper |
| 2011/0252018 A1 | 10/2011 | Bhose |
| 2011/0296075 A1 | 12/2011 | Kuan |
| 2012/0244806 A1 * | 9/2012 | Sekiya ......................... 455/41.2 |
| 2012/0324068 A1 | 12/2012 | Jayamohan |
| 2015/0079815 A1 * | 3/2015 | Leigh et al. ..................... 439/74 |

OTHER PUBLICATIONS

Memory for Dell Power Edge 12th Generation Servers, 16pp, http://www.dell.com/downloads/global/products/pedge/poweredge-12th_generation_server_memory.pdf.

A Reconfigurable Computing System Based on a Cache-Coherent Fabric, 6pp, https://elkingarcia.github.io/Papers/Reconfig11.pdf.

* cited by examiner

100

150

SOCKET INTERPOSER AND COMPUTER SYSTEM USING THE SOCKET INTERPOSER

BACKGROUND

Modern server applications, such as data centers and server rack environments, typically use multiple server nodes that cooperate together to provide services to clients. Conventional server motherboards are typically used in such server nodes. A server motherboard includes at least a circuit board having a number of sockets configured to fit various components, one or more processors (e.g. CPUs), and an interface for performing external communication. Other components may also be used. Some of these may be incorporated into the circuit board or may fit dedicated socket(s) on the circuit board. The CPUs include connectors having a form factor that mates with CPU sockets on the circuit board. Stated differently, the CPU sockets on the circuit board have the same form factor as the connectors (or pins) for the CPU. With latest server architecture, the CPU sockets on the circuit board are coupled to dedicated memory, such as DIMM, for each CPU. This dedicated memory is accessible through the CPU. The interface for performing external node-to-node communication is generally an Ethernet interface. Such an input/output interface typically includes Ethernet controller coupled to a port. The port is typically a PCIE port from southbridge which is interconnected to the first of the two CPUs.

In operation, each server board performs calculations using at least its internal CPUs. Dedicated memory for each CPU may provide faster access to items in the dedicated memory. For external communication data are routed to/from their locations in memory from/to the Ethernet interface. Similarly, CPU commands, requests, and other information are routed from/to the CPU to/from the Ethernet interface. Thus, server boards may operate individually or together to provide the desired operations.

In server applications, low latency and fast communication between server nodes is desirable. The server boards in such an environment exchange data and perform communication with CPUs on other server boards through the Ethernet I/O interface. Because of the location of the Ethernet controller and port, there may be a long path between the Ethernet interface and some data on the server board. Further, the port is generally universal to all the data through the Ethernet interface. Thus, there may be a relatively large overhead and long latency for memory data exchanges. This is undesirable.

Many server boards include first and second CPUs residing in first and second CPU sockets on the circuit board. However, some server applications may not need two CPUs in the server board. If a single CPU is adequate for the computational needs, the second socket in the circuit board may be left empty. Use of a single CPU in the server board may reduce the power consumption, which is generally desirable. There is also a cost savings due to the omission of the second CPU. However, as discussed above, each CPU socket and thus each CPU typically has dedicated memory. Leaving one of the CPU sockets empty may preclude access to the dedicated memory for that CPU socket. Thus, the reduction in power and cost achieved by omitting a CPU may be offset by limitations in the memory for the server board for many applications which require large memories but are not calculation intensive.

Accordingly, a server board having improved functionality is desired.

BRIEF SUMMARY

Exemplary embodiments include a socket interposer having a plurality of connectors and at least one of on-board memory and an external communication controller. The plurality of connectors is configured to fit with a form factor of a socket on a server board. The server board includes at least one processor and a circuit board having the socket and at least one processor socket. The processor(s) are coupled with the processor socket(s). The socket has the form factor configured for a module having a first functional set and the form factor. The at least one of the on-board memory and the external communication controller is coupled with at least some of the connectors. The external communication controller also has a second functional set different from the first functional set. The on-board memory is configured to be usable by the processor(s).

According to the method and system disclosed herein, the exemplary embodiments provide a mechanism for extending the functionality of a circuit board using preexisting socket(s). For example, communication, memory and/or other features may be enhanced.

DETAILED DESCRIPTION

Figure 1:
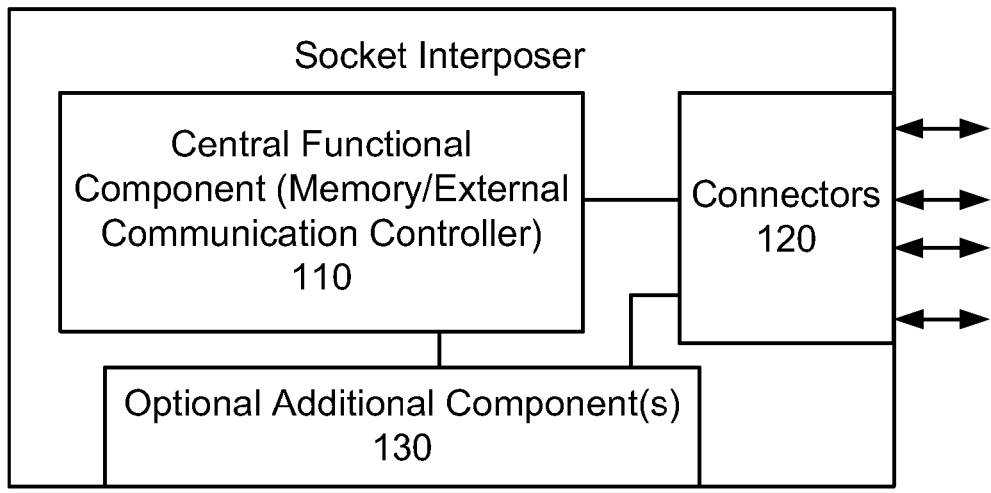
FIG. 1 is a block diagram of an exemplary embodiment of a socket interposer.

The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. Further, although specific blocks are depicted, various functions of the blocks may be separated into different blocks or combined. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein. Reference is made in detail to the embodiments of the present general inventive concept, examples of which are illustrated in the accompanying drawings, wherein like reference numerals refer to the like elements throughout.

The embodiments are described below in order to explain the present general inventive concept while referring to the figures. The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified.

Figure 2:
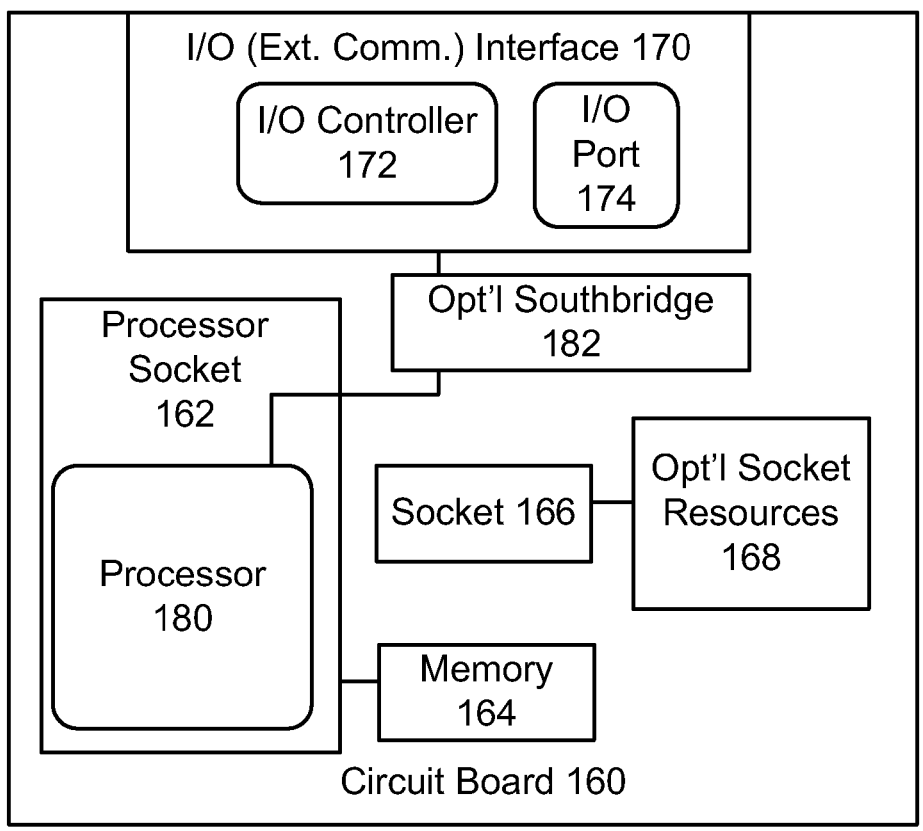
FIG. 2 is a block diagram of an exemplary embodiment of a computer system in which the exemplary embodiment socket interposer may reside.

FIG. 1 is a block diagram illustrating an exemplary embodiment of a socket interposer 100. FIG. 2 depicts a computer system 150 in which the socket interposer 100 may be employed. FIG. 2, therefore, depicts an exemplary embodiment of an environment in which the socket interposer 100 may operate. The computer system 150 may be a server board that may be part of a data center or other server application. In other embodiments, however, the computer system 150 may reside in another environment and/or perform other functions.

Referring to FIGS. 1-2, the computer system 150 includes a circuit board 160 external communication interface 170, processor 180 and optional southbridge 182. The circuit board 160 includes sockets 162 and 166. The socket 162 is a processor socket. The processor 180 may be a CPU and has pins (not shown in FIG. 2) having a form factor configured to fit the processor socket 162. The processor 180 may thus be plugged into the processor socket 162 for the computer system 160 to function as a server board. The circuit board 160 also includes dedicated memory 164 for the processor 180/processor socket 162. In some embodiments, dedicated memory 164 is a DIMM plugged into a DIMM slot on the circuit board 160. However, in other embodiments, the dedicated memory 164 may be provided in another manner. Also shown in the computer system 150 is input/output (I/O) interface 170. Essentially, the I/O interface 170 is used for external communication. The I/O interface 170 includes I/O port(s) 174 and I/O controller 172. In some embodiments, the I/O controller 172 is an Ethernet controller. In other embodiments, other controllers using other protocols for external communication may be used.

The circuit board 166 also includes the socket 166 that may be associated with optional socket resources 168. The socket 166 has a number of connectors configured to receive pins in a module that have the same form factor. The connectors connect the module placed in the socket 166 to, among other components, the socket resources 168. In some embodiments, the socket 166 may be a processor socket. In such an embodiment, the socket 166 connectors may be configured to receive the pins of a CPU such as the processor 180. In other embodiments, the socket 166 may be configured for another module. For example, the socket 166 may be a DIMM socket or other socket having connectors configured in a form factor for a particular module. The socket 166 and, if present, socket resource 168 may be used in performing a corresponding set of functions of the particular module. For example, if the socket 166 is a CPU socket, the optional socket resources 168 may include a DIMM for use by the processor for which the socket 166 is configured. Thus, the circuit board 160 is configured to fit and be used with specific preexisting components.

The socket interposer 100 includes a central functional component 110, connectors 120 and optional additional component(s) 130. The connectors 120 include a number of pins having a configuration, or form factor, configured to fit the socket 166 on the computer system 150. Stated differently, the socket interposer 100 may be plugged into the socket 166 and will function within the computer system 150. For example, if the socket 166 is a CPU socket, then the connectors 120 of the socket interposer 100 have the same form factor as the processor 180.

The central functional component 110 performs various functions for the computer system 150. In some embodiments, the central functional component 110 is an on-board memory such as a flash or an external communication controller. The external communication controller may be an Ethernet controller, an InfiniBand controller, an optical communication controller and/or another type of communication controller. The central functional component 110 may also include other subcomponents such as one or more ports (not explicitly shown in FIG. 1). In other embodiments, the central functional component 110 may have other and/or additional functions.

The functions performed by the socket interposer 100 and, therefore, the central functional component 110, are different than that of the module for which the socket 166 is designed. For example, if the socket 166 is a CPU socket, then the connectors 120 of the socket interposer 100 may have the same form factor as the connectors for the processor 180. However, the central functional component 110 provides different functions than the processor 180. For example, the central functional component 110 may be an on-board flash memory. As such, the central functional component does not perform the calculations of the processor 180. Similarly, the central functional component 110 may include an external communication controller such as an Ethernet controller analogous to the controller 172. Thus, the central functional component 110 performs various operations that are different from, but may complement, the operations performed by the processor 180 or other component with which the socket 166 is designed to operate.

The socket interposer 100 may also include optional additional component(s) 130. The optional additional component(s) 130 may be used to extend the functionality of the socket interposer 100. For example, the optional additional component(s) may include a transceiver such as a CPU interlink interface. Such a transceiver may allow direct communication between the processor 180 and the central functional component 110. The additional component(s) 130 may also include a controller or other component that allows the socket interposer 100 to utilize the optional socket resources 168. For example, a memory interface and/or controller may be part of the optional additional component(s) 130.

The socket interposer 100 may enhance the functionality of the computer system 150. The preexisting circuit board 160 having preexisting socket 166 may be provided with the new functions of the socket interposer 100. In particular, a socket 166 designed for one module with a first set of functions may be used to perform another set of functions using the socket interposer. For example, if the socket 166 is a CPU socket and the computer system 150 is used in a server application for which one CPU is sufficient, then the cost of an additional processor may be saved. Instead, a single processor 180 may be used. Such a server board 150 may also have reduced power consumption. Using the socket interposer 100, the optional socket resources 168 that would be unavailable if the socket 166 were left open are now available. For example, DIMM for a CPU socket may now be accessible via the socket interposer 100. Low latency access to the memory that would otherwise be unavailable may thus be obtained. If the socket interposer 100 includes an external communication controller such as an Ethernet controller, then access to the memory of the computer system 150 may be more rapidly made through both the I/O interface 170 and the socket interposer 100. For example, the processor 180 may opt to use the I/O interface through the external communication controller in the socket interposer 100 if the latency of the I/O interface is greater than a particular threshold. Faster communication may be preserved. Thus, lower latency communication between server boards may be achieved. If the socket interposer 100 includes on-board memory, then the memory capacity of the computer system 150 may also be enhanced. One or more of these benefits may be attained without impacting the design and implementation of preexisting circuit board 160 and preexisting computer systems 150.

FIGS. 3-7 depict various embodiments of socket interposers and computer systems in which the socket interposers may reside that are analogous to the socket interposer 100 and computer system 150, respectively. Analogous components in FIGS. 3-7 are thus labeled similarly to those in FIGS. 1 and 2.

Figure 3:
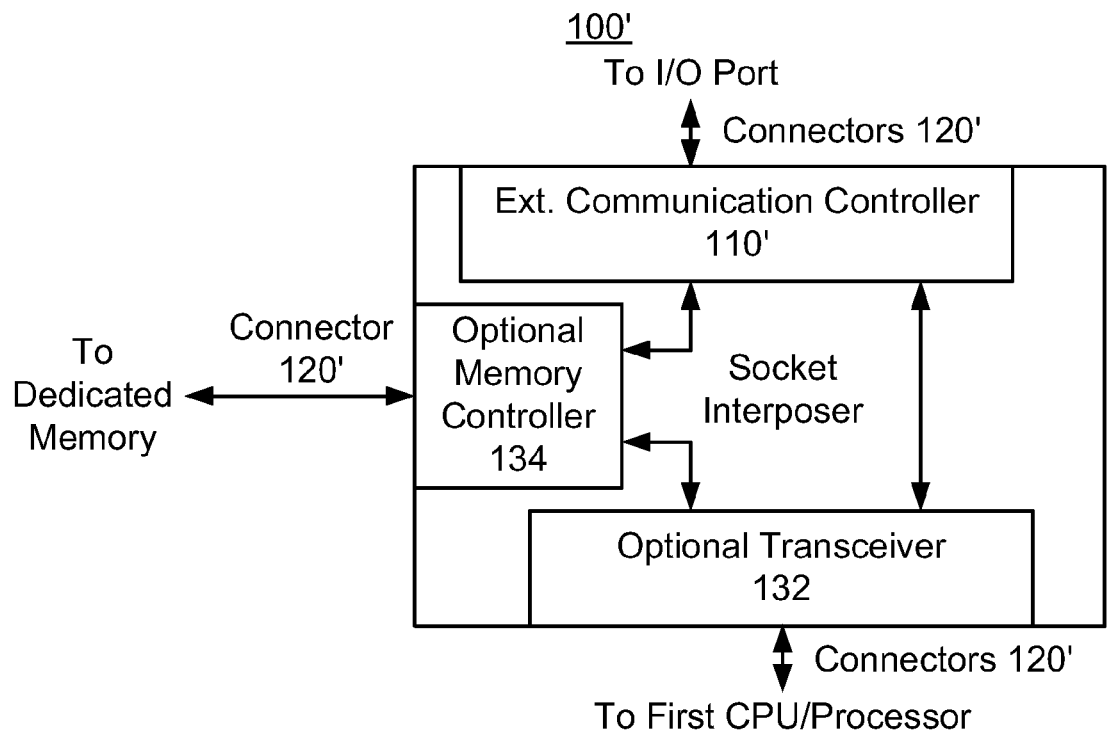
FIG. 3 is a block diagram of another exemplary embodiment of a socket interposer.
Figure 4:
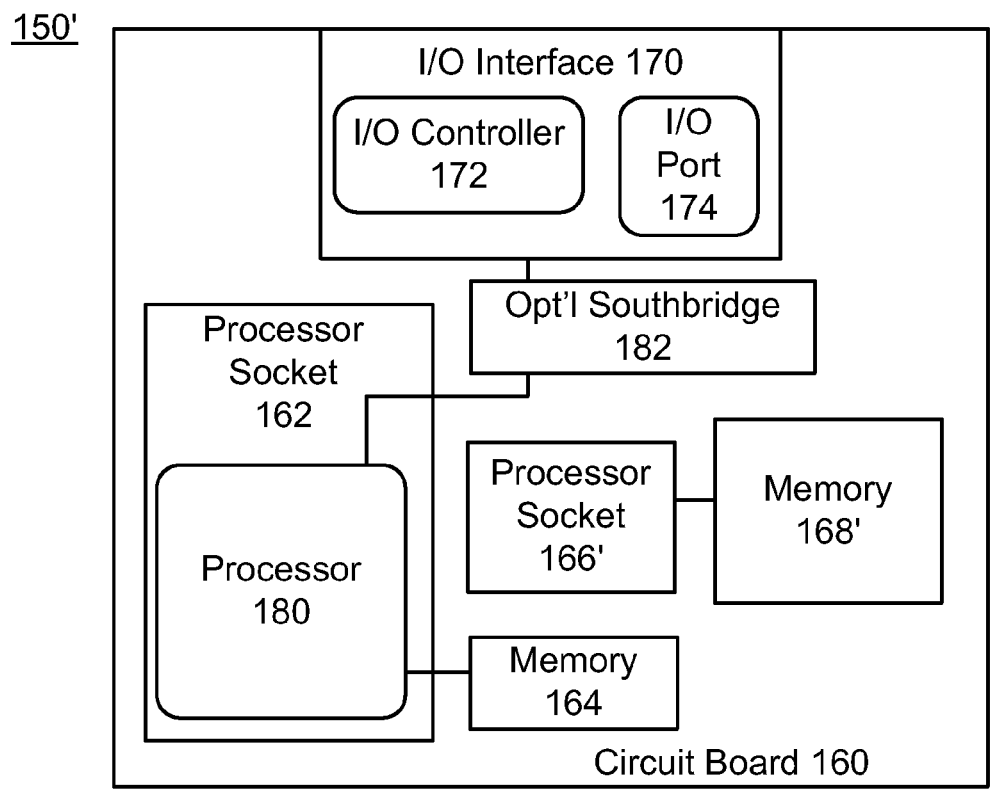
FIG. 4 is a block diagram of an exemplary embodiment of a computer system in which the exemplary embodiment of the socket interposer resides.

FIG. 3 is a block diagram illustrating an exemplary embodiment of a socket interposer 100'. FIG. 4 depicts a computer system 150' in which the socket interposer 100 may be employed. FIG. 4, therefore, depicts an exemplary embodiment of an environment in which the socket interposer 100' may operate. The computer system 150' may be a server board that may be part of a data center or other server application. Thus, in the context of FIGS. 3-9, the computer system 150' is described as server board 150'. In other embodiments, however, the server board 150' may reside in another environment and/or perform other functions.

Referring to FIGS. 3 and 4, the server board 150' includes a circuit board 160 external communication interface 170, processor 180 and optional southbridge 182. The circuit board 160 includes CPU sockets 162 and 166'. Although not specifically shown, the circuit board 160 may include other socket(s). The processor 180 may be a CPU and has pins (not shown in FIG. 4) having a form factor configured to fit the processor socket 162 and/or 166'. The processor 180 may thus be plugged into the processor socket 162 or 166'. The circuit board 160 also includes dedicated memories 164 and 168' for the processor 180/processor socket 162 and processor socket 166'. In some embodiments, dedicated memories 164 and 168' are each a DIMM plugged into a DIMM slot on the circuit board 160. However, in other embodiments, the dedicated memories 164 and/or 168' may be configured in another manner. Also shown in the computer system 150 is input/output (I/O) interface 170 including I/O port(s) 174 and I/O controller 172. In some embodiments, the I/O controller 172 is an Ethernet controller. In other embodiments, other controllers using other protocols for external communication may be used. The server board 150' may also include other socket(s), connections, and/or other components.

The socket interposer 100' includes an external communication controller 110', connectors 120', transceiver 132 and memory controller 134. The external communication controller 110' is an exemplary embodiment of the central functional moment. The transceiver 132 and memory controller 134 correspond to optional additional component(s) 130 depicted in FIG. 1. Referring back to FIGS. 3-4, the connectors 120' include a number of pins having a configuration, or form factor, configured to fit the processor socket 166' on the computer system 150'. Stated differently, the socket interposer 100' may be plugged into the processor socket 166' and will function within the server board 150'.

The external communication controller 110' may be an Ethernet controller, an InfiniBand controller, an optical communication controller and/or another type of communication controller. The external communication controller 110' may also include other subcomponents such as one or more ports (not separately shown in FIG. 3). The external communication controller 110' may be used to provide direct access to other server boards. Thus, the external communication controller 110' may be used to provide an I/O interface through the socket 166'.

The socket interposer 100' may also include optional transceiver 132. The optional transceiver 132 may be used to provide a CPU interlink interface. Thus, communication directly with the processor 180 may be performed. Stated differently, the processor 180 may be used for communication via the I/O interface 170 and/or the socket interposer 100'.

Also included in the socket interposer 100' may be a memory controller 134. The memory controller 134 is directly connected to the dedicated memory 168' through the connector(s) 120'. The memory controller 134 is also coupled with the external communication controller 110' and the transceiver 132. Although the memory controller 134 is shown as being directly connected to components 110' and 132, in other embodiments, the components 110', 132 and 134 may be coupled via other components (not shown). The contents of the memory 168' may be provided directly to the external communication controller 110' and/or the transceiver 132. As a result, lower latency communication between the dedicated memory 168' and other server boards (not shown)/the processor 180.

The socket interposer 100' may enhance the functionality of the computer system 150'. The preexisting circuit board 160 having preexisting processor socket 166' may be provided with the new functions of the socket interposer 100'. In particular, a server board 150' may use a single processor 180, thus saving the cost of an additional processor. The server board 150' may also have reduced power consumption. Using the socket interposer 100, the dedicated memory 168' that would be unavailable if the socket 166 were left open is now available through the interposer 100'. Because of the external communication controller 110', access to the memory of the computer system 150' may be more rapidly made through both the I/O interface 170 and the socket interposer 100'. For example, the processor 180 may opt to use the I/O interface through the external communication controller 110' in the socket interposer 100' if the latency of the I/O interface is greater than a particular threshold. In some embodiments accesses to the memory 168' may always be made through the controller 110'. Such accesses generally have lower latency than accesses of the memory 168' through I/O interface 170 and processor 180. In other embodiments, accesses to the memory 168' may be made through the controller 110' if the latency of such an access through the I/O interface 170 exceeds a threshold or if the latency of an access of the memory 168' through the I/O interface 170 exceeds another threshold. Thus, lower latency communication between server boards may be achieved. One or more of these benefits may be attained without impacting the design and implementation of preexisting circuit board 160 and preexisting computer systems 150'.

Figure 5:
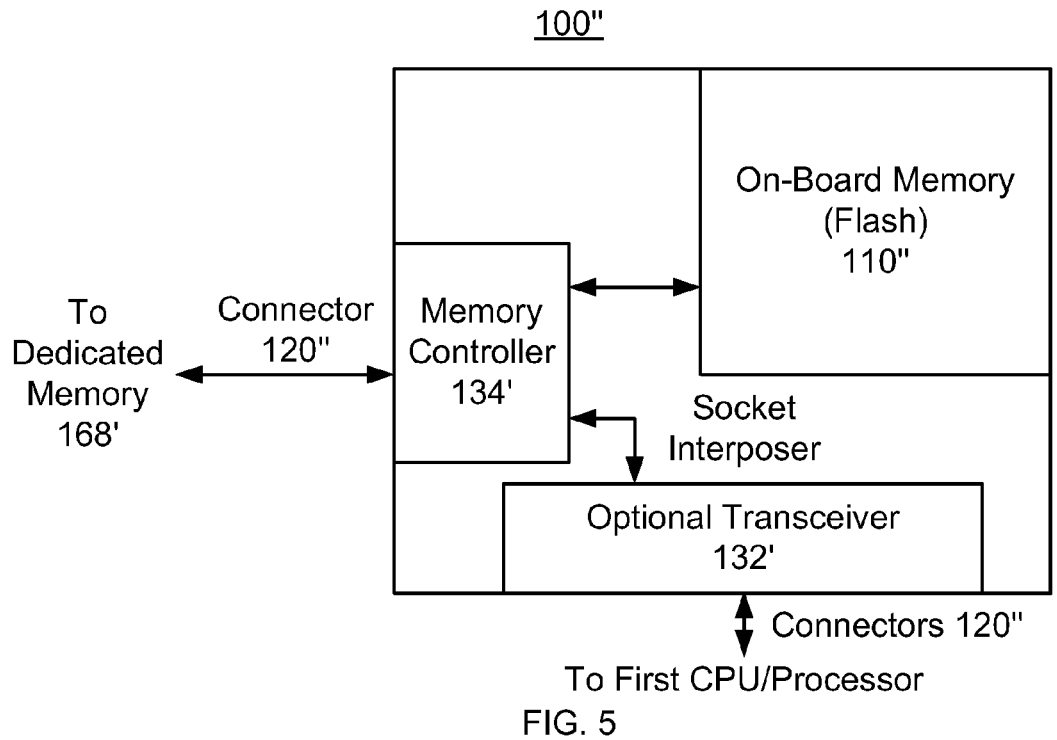
FIG. 5 is a block diagram of another exemplary embodiment of a socket interposer.

FIG. 5 is a block diagram illustrating an exemplary embodiment of a socket interposer 100". The socket interposer 100" may be used with the server board 150' depicted in FIG. 4. The socket interposer 100" is thus described in the context of the server board 150'. Referring to FIGS. 4 and 5, the socket interposer 100" includes an on-board memory 110", connectors 120", transceiver 132' and memory controller 134'. The on-board memory 110" is an embodiment of the functional component 110. The transceiver 132' and memory controller 134' correspond to optional additional component(s) 130' depicted in FIG. 1. Referring back to FIGS. 4 and 5, the connectors 120" include a number of pins having a configuration, or form factor, configured to fit the processor socket 166' on the computer system 150'. Stated differently, the socket interposer 100" may be plugged into the processor socket 166" and will function within the server board 150".

The socket interposer 100" may also include optional transceiver 132'. The optional transceiver 132' may be used to provide a CPU interlink interface. Thus, communication directly with the processor 180 may be performed. Stated differently, the processor 180 may be used for communication via the I/O interface 170 and/or the socket interposer 100'.

Also included in the socket interposer 100" may be a memory controller 134'. The memory controller 134' is directly connected to the dedicated memory 168' through the connector(s) 120". The memory controller 134 is also coupled with the on-board memory 110" and the transceiver 132'. The memory controller 134' is shown as being directly connected to components 110" and 132'. However, in other embodiments, the components 110", 132' and 134' may be coupled via other components (not shown). The contents of the memory 168' may be provided directly to the on-board memory 110" and/or the transceiver 132'. As a result, lower latency communication between the dedicated memory 168' and other server boards (not shown)/the processor 180/the memory 110".

The on-board memory 110" may be nonvolatile memory. For example, a flash memory may be used. Other forms of nonvolatile memory may also be employed. The on-board memory 100" is accessible via the memory controller 134. Thus, the CPU 180 may access the on-board memory 110" via the transceiver 132' and memory controller 134'. Use of a nonvolatile memory may enhance the flexibility of the dedicated memory 168. In alternate embodiments, volatile memory such as DRAM may be used.

The socket interposer 100" may enhance the functionality of the computer system 150'. The preexisting circuit board 160 having preexisting processor socket 166' may be provided with the new functions of the socket interposer 100". In particular, a server board 150' may use a single processor 180, thus saving the cost of an additional processor. The server board 150' may also have reduced power consumption. Using the socket interposer 100', the dedicated memory 168' that would be unavailable if the socket 166 were left open is now available through the interposer 100'. Because of the on-board memory 110", the computer system 150' may have greater memory resources available to it. Thus, lower latency access to memory resources may be achieved. One or more of these benefits may be attained without impacting the design and implementation of preexisting circuit board 160 and preexisting computer systems 150'.

Figure 6:
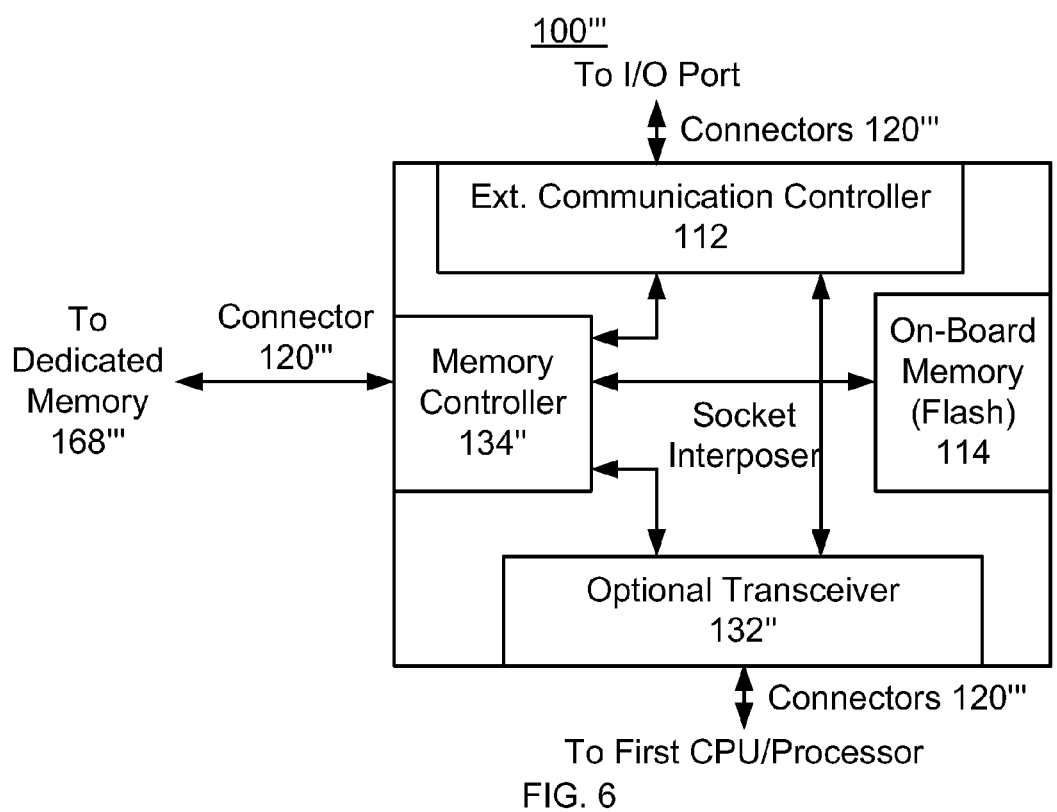
FIG. 6 is a block diagram of another exemplary embodiment of a socket interposer.

FIG. 6 is a block diagram illustrating an exemplary embodiment of a socket interposer 100'''. The socket interposer 100''' may be used with the server board 150' depicted in FIG. 4. The socket interposer 100''' is thus described in the context of the server board 150'. Referring to FIGS. 4 and 6, the socket interposer 100''' includes an external communication controller 112, an on-board memory 114, connectors 120''', transceiver 132" and memory controller 134". The external communication controller 112 and on-board memory 114 together form an embodiment of the functional component 110. The transceiver 132" and memory controller 134" correspond to optional additional component(s) 130' depicted in FIG. 1. Referring back to FIGS. 4 and 6, the connectors 120''' include a number of pins having a configuration, or form factor, configured to fit the processor socket 166' on the computer system 150'. Stated differently, the socket interposer 100''' may be plugged into the processor socket 166''' and will function within the server board 150'''.

The external communication controller 112 may be an Ethernet controller, an InfiniBand controller, an optical communication controller and/or another type of communication controller. The external communication controller 112 may also include other subcomponents such as one or more ports (not separately shown in FIG. 6). The external communication controller 112 may be used to provide direct access to other server boards. Thus, the external communication controller 112 may be used to provide an I/O interface through the socket 166'.

The socket interposer 100''' may also include optional transceiver 132". The optional transceiver 132" may be used to provide a CPU interlink interface. Thus, communication directly with the processor 180 may be performed. Stated differently, the processor 180 may be used for communication via the I/O interface 170 and/or the socket interposer 100'.

Also included in the socket interposer 100''' may be a memory controller 134". The memory controller 134" is directly connected to the dedicated memory 168' through the connector(s) 120'''. The memory controller 134 is also coupled with the external communication controller 112, the on-board memory 114 and the transceiver 132". The memory controller 134" is shown as being directly connected to components 112, 114, and 132". However, in other embodiments, the components 112, 114, 132" and 134" may be coupled via other components (not shown). The contents of the memory 168' may be provided directly to the external communication controller 112, the on-board memory 114 and/or the transceiver 132". As a result, lower latency communication between the dedicated memory 168' and other server boards (not shown)/the processor 180.

The on-board memory 100" may be nonvolatile memory. For example, a flash memory and/or other nonvolatile memory may be used. In other embodiments, volatile memory such as DRAM may be used. The on-board memory 100" is accessible via the memory controller 134. Thus, the CPU 180 may access the on-board memory 110" via the transceiver 132' and memory controller 134'.

The socket interposer 100''' may enhance the functionality of the computer system 150'. The preexisting circuit board 160 having preexisting processor socket 166' may be provided with the new functions of the socket interposer 100'''. In particular, a server board 150' may use a single processor 180, thus saving the cost of an additional processor. The server board 150' may also have reduced power consumption. Using the socket interposer 100′′′, the dedicated memory 168′ that would be unavailable if the socket 166 were left open is now available through the interposer 100′′′. Because of the on-board memory 114, the computer system 150′ may have greater memory resources available to it. Thus, lower latency access to memory resources may be achieved. Because of the external communication controller 112, access to the memory of the computer system 150′ may be more rapidly made through both the I/O interface 170 and the socket interposer 100′′′. Selection of the I/O interface or external communication controller 112 for performing communication may be made based on latency thresholds, the location in memory being accessed and/or other factors. Thus, lower latency communication between server boards may be achieved. One or more of these benefits may be attained without impacting the design and implementation of preexisting circuit board 160 and preexisting computer systems 150′.

Figure 7:
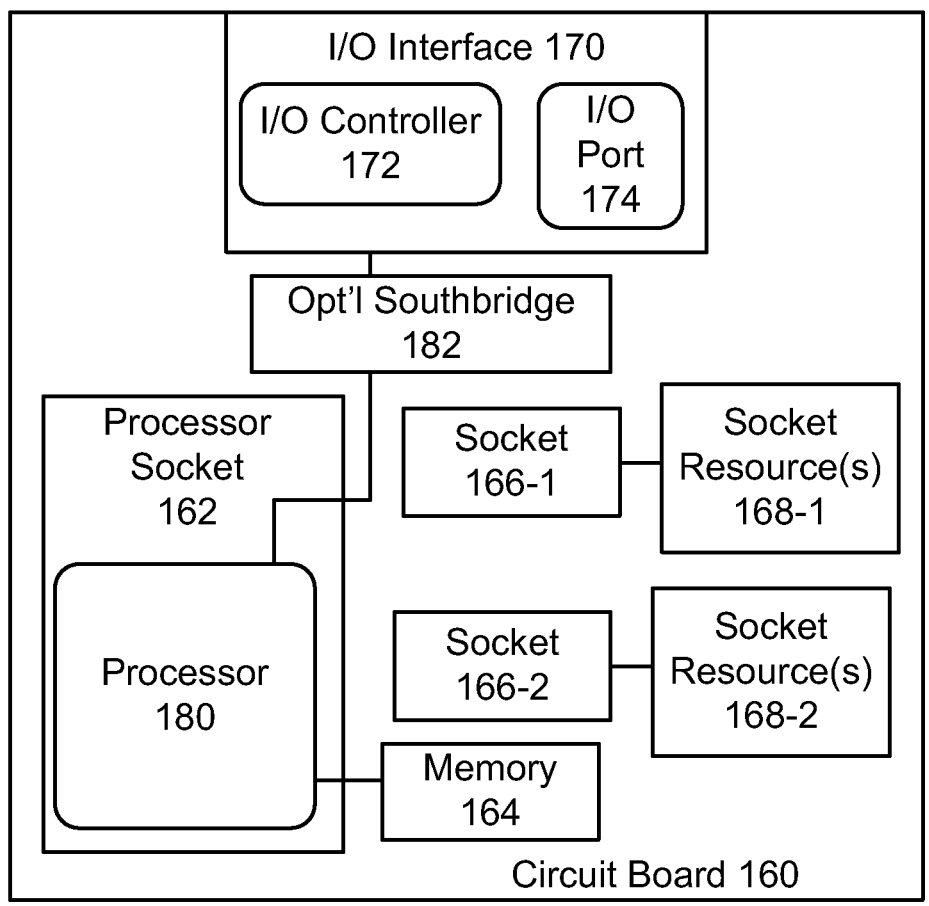
FIG. 7 is a block diagram of another exemplary embodiment of a computer system in which the exemplary embodiment of the socket interposer resides.

FIG. 7 depicts a computer system 150′′ in which one or more of the socket interposers 100, 100′, 100′′ and/or 100′′′ may be employed. FIG. 7, therefore, depicts an exemplary embodiment of an environment in which the socket interposer 100, 100′, 100′′ and/or 100′′′ may operate. The computer system 150′′ may be a server board that may be part of a data center or other server application. The server board 150′′ includes a circuit board 160 external communication interface 170, processor 180 and, optionally, southbridge 182. The circuit board 160 includes CPU socket 162. Although not specifically shown, the circuit board 160 may include other socket(s). The processor 180 may be a CPU and has pins (not shown in FIG. 7) having a form factor configured to fit the processor socket 162. The processor 180 may thus be plugged into the processor socket 162. The circuit board 160 also includes dedicated memory 164 for the processor 180/processor socket 162. In some embodiments, dedicated memory 164 and is a DIMM plugged into a DIMM slot on the circuit board 160. However, in other embodiments, the dedicated memory 164 may be configured in another manner. Also shown in the computer system 150′′ is input/output (I/O) interface 170 including I/O port(s) 174 and I/O controller 172. In some embodiments, the I/O controller 172 is an Ethernet controller. In other embodiments, other controllers using other protocols for external communication may be used. The server board 150′′ may also include other socket(s), connections, and/or other components.

The server board 150′′ also includes sockets 166-1 and 166-2. Each socket 166-1 and 166-2 has dedicated memory 168-1 and 168-2. The sockets 166-1 and 166-2 correspond to socket 166 and 166′. In some embodiments, the sockets 166-1 and 166-2 are both CPU sockets. In other embodiments, one of the sockets 166-1 or 166-2 is a CPU socket. In still other embodiments, neither socket 166-1 nor 166-2 is a CPU socket. The socket resources 168-1 and 168-2 correspond to the optional socket resources 168 and memory 168′. Thus, one or both of the socket resources 168-1 and 168-2 may be a dedicated memory or other resources. The socket modules 100, 100′, 100′′ and/or 100′′′ may be used in connection with the sockets 166-1 and 166-2. Thus, the benefits of the socket modules 100, 100′, 100′′ and/or 100′′′ may be achieved.

Figure 8:
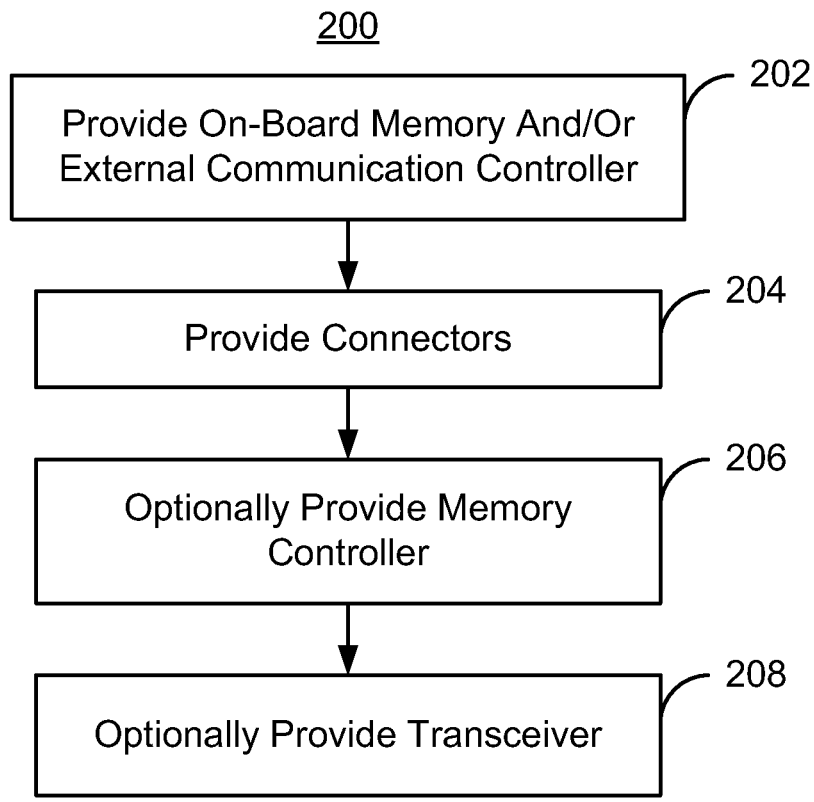
FIG. 8 is a flow chart depicting an exemplary embodiment of a method for providing a socket interposer.

FIG. 8 is a flow chart depicting an exemplary embodiment of a method 200 for fabricating a socket interposer such as the socket interposer 100, 100′, 100′′, and/or 100′′. For simplicity, some steps may be omitted or combined. The method 200 is described in the context of the socket interposer 100. However, the method 200 may be used for other socket interposers.

The functional component 110 is provided, via step 202. Step 202 may include providing an on-board memory and/or providing an external communication controller. The connectors 120 are provided for the socket interposer 100, via step 204. Step 204 includes configuring the connectors to have the desired form factor. For example, the connectors 120 may be configured for a CPU socket. Optional additional component(s) 130 may be provided in steps 206 and 208. For example, a memory controller may be provided, via step 206. The transceiver may be provided in step 208. Steps 206 and 208 may include connecting the memory controller and/or transceiver to the desired pins/connectors for the socket interposer 100.

Using the method 200, the socket interposer 100, 100′, 100′′, 100′′′ and/or an analogous socket interposer may be provided. Thus, one or more of the benefits described herein may be achieved.

Figure 9:
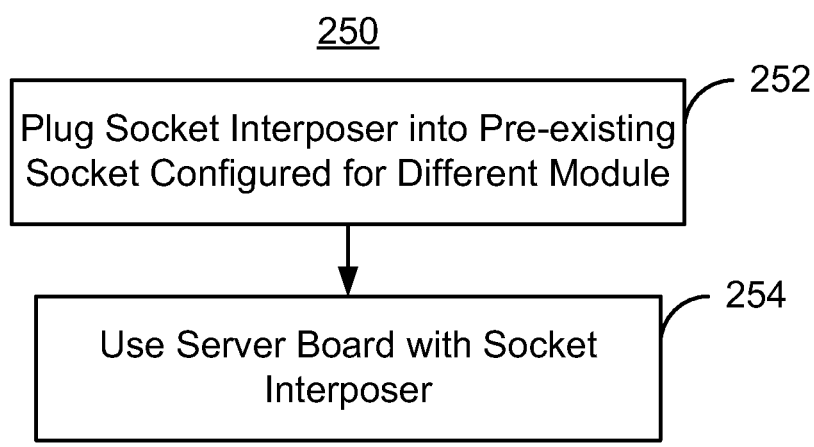
FIG. 9 is a flow chart depicting an exemplary embodiment of a method for using a socket interposer.

FIG. 9 is a flow chart depicting an exemplary embodiment of a method 250 for using a socket interposer such as the socket interposer 100, 100′, 100′′, and/or 100′′. For simplicity, some steps may be omitted or combined. The method 250 is described in the context of the socket interposer 100 and computer system 150. However, the method 250 may be used for other socket interposers and/or other computer systems.

The socket interposer 100 is plugged into the appropriate, preexisting socket 166 of the computer system 150, via step 252. The socket interposer 100 is thus plugged into a socket designed and fabricated for another component. The computer system 150, or server board, is then used with the socket interposer 100 in place.

Using the method 250, the socket interposer 100, 100′, 100′′, 100′′′ and/or an analogous socket interposer may be connected with the desired computer system 150, 150′, 150′′ and/or analogous computer system. Thus, the computer system may enjoy better function and/or performance. For example, the latency of communication may be reduced and/or the memory resource available may be enhanced. As a result, performance of the computer system may be improved.

A method and system for a socket interposer has been disclosed. The present invention has been described in accordance with the embodiments shown, and there could be variations to the embodiments, and any variations would be within the spirit and scope of the present invention. Accordingly, many modifications may be made by one of ordinary skill in the art without departing from the spirit and scope of the appended claims.

I claim:

1. A socket interposer comprising:
    a plurality of connectors configured to fit with a form factor of a socket on a server board, the server board including at least one processor and a circuit board having the socket and at least one processor socket, the at least one processor being coupled with the at least one processor socket, the socket having the form factor configured for a module having a first functional set and a plurality of module connectors in the form factor, the at least one processor being at least one central processing unit (CPU) for the circuit board, the at least one processor socket being at least one CPU socket, the socket being an additional CPU socket, the form factor being a CPU form factor, the first functional set including a plurality of processor functions; and
    at least one of on-board memory and an external communication controller, the at least one of the on-board memory and the external communication controller coupled with at least a portion of the plurality of connectors, the on-board memory configured to be usable by the at least one processor, the external communication controller having a second functional set different from the first functional set.

2. The socket interposer of claim 1 wherein the socket interposer includes the external communication controller.

3. The socket interposer of claim 2 wherein the socket is coupled with dedicated memory on the circuit board and wherein the socket interposer further includes:
   at least one memory controller coupled with the external communication controller for providing direct access between the external communication controller and the dedicated memory.

4. The socket interposer of claim 3, wherein the socket interposer further includes:
   at least one transceiver coupled with the communication controller for providing direct access from the external communication controller to the at least one processor.

5. The socket interposer of claim 2 wherein the socket interposer further includes:
   the on-board memory configured to be usable by the at least one processor.

6. The socket interposer of claim 2 wherein the external communication controller controls communications with at least one device external to the server board.

7. The socket interposer of claim 1 wherein the socket interposer includes the on-board memory.

8. The socket interposer of claim 7, wherein the socket is coupled with dedicated memory on the server board and wherein the socket further includes:
   a memory controller configured to allow the at least one processor access to the dedicated memory and to the on-board memory.

9. The socket interposer of claim 7, wherein the socket interposer further includes:
   at least one transceiver coupled with the communication controller for providing direct access to the at least one processor.

10. The socket interposer of claim 7 wherein the on-board memory is a flash memory.

11. A computer system comprising:
   a circuit board including at least one processor socket having a processor form factor and at least one additional socket having a form factor for a module corresponding to a first functional set and having the form factor, the at least one processor socket being a central processing unit (CPU) socket, the processor form factor being a CPU form factor, the at least one additional socket being at least one additional CPU socket, the form factor being the CPU form factor, the first functional set including a plurality of processor functions, the circuit board being a server board;
   at least one processor having the processor form factor and coupled with the at least one processor socket, the at least one processor being at least one CPU for the circuit board; and
   at least one socket interposer, each of the at least one socket interposer including a plurality of connectors and at least one of on-board memory and an external communication controller, the at least one of the on-board memory and the external communication controller being coupled with at least a portion of the plurality of connectors, the plurality of connectors being configured to fit with the form factor of the at least one additional socket, the on-board memory configured to be usable by the at least one processor, the external communication controller having a second functional set different from the first functional set.

12. The computer system of claim 11 wherein the at least one socket is coupled with dedicated memory on the circuit board, wherein the at least one socket interposer includes the external communication controller, and wherein the at least one socket interposer further includes:
   at least one memory controller coupled with the external communication controller, the memory controller providing direct access between the communication controller and the dedicated memory.

13. The computer system of claim 12, wherein the at least one socket interposer further includes:
   at least one transceiver coupled with the communication controller for providing direct access from the communication controller to the at least one processor.

14. The computer system of claim 12 wherein the on-board memory is a flash memory.

15. The computer system of claim 11 wherein the at least one socket interposer includes the on-board memory.

16. The computer system of claim 15 wherein the at least one socket interposer further includes:
   a memory controller configured to allow the at least one processor access to the on-board memory.

17. The computer system of claim 15 wherein the at least one socket is coupled with dedicated memory on the circuit board, wherein the at least one additional socket interposer includes the on-board memory, and wherein the at least one additional socket interposer further includes:
   at least one memory controller for providing direct access to the communication dedicated memory and the on-board memory.

18. The computer system of claim 17, wherein the socket interposer further includes:
   at least one transceiver coupled with the communication controller for providing direct access to the at least one processor.

19. The computer system of claim 18, further comprising:
   on-board memory coupled with the memory controller and the at least one processor.

20. The computer system of claim 11 wherein the computer system is a server board.

21. The computer system of claim 11 wherein the external communication controller controls communications with at least one device external to the circuit board.

22. A method for providing a computer system comprising:
   plugging a socket interposer into a socket of a circuit board of the computer system, the socket interposer including a plurality of connectors and at least one of on-board memory and an external communication controller, the plurality of connectors configured to fit with a form factor of the socket, the computer system board including at least one central processing unit (CPU) and the circuit board having the socket and at least one CPU socket, the at least one CPU being coupled with the at least one CPU socket, the socket having the form factor configured for a module having a first functional set and a plurality of module connectors in the form factor, the socket being an additional CPU socket, the form factor being a CPU form factor, the first functional set including a plurality of processor functions, the at least one of the on-board memory and the external communication controller coupled with the plurality of connectors, the on-board memory configured to be usable by the at least one processor, the external communication controller having a second functional set different from the first functional set.

23. The method of claim 22 wherein the external communication controller controls communications with at least one device external to the computer system board.

24. The method of claim 22 wherein the on-board memory is a flash memory.

* * * * *